(12) United States Patent
Qin et al.

(10) Patent No.: US 11,122,684 B2
(45) Date of Patent: Sep. 14, 2021

(54) DISPLAY SUBSTRATE, DISPLAY DEVICE AND METHOD FOR MANUFACTURING DISPLAY SUBSTRATE

(71) Applicant: BOE TECHNOLOGY GROUP CO., LTD., Beijing (CN)

(72) Inventors: Bin Qin, Beijing (CN); Jintao Peng, Beijing (CN); Yanan Niu, Beijing (CN); Jinyu Ren, Beijing (CN); Fangzhen Zhang, Beijing (CN); Kuanjun Peng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/810,016

(22) Filed: Mar. 5, 2020

(65) Prior Publication Data

US 2021/0185803 A1 Jun. 17, 2021

(30) Foreign Application Priority Data

Dec. 17, 2019 (CN) .......................... 201911304902.3

(51) Int. Cl.
*H05K 1/02* (2006.01)
*H05K 1/18* (2006.01)

(52) U.S. Cl.
CPC ............ *H05K 1/0283* (2013.01); *H05K 1/18* (2013.01); *H05K 2201/0989* (2013.01); *H05K 2201/10128* (2013.01)

(58) Field of Classification Search
CPC ................... H05K 1/0283; H05K 1/18; H05K 2201/0989; H05K 2201/10128
See application file for complete search history.

(56) References Cited

U.S. PATENT DOCUMENTS

| | | | |
|---|---|---|---|
| 2010/0330338 A1* | 12/2010 | Boyce | B29C 59/02 428/156 |
| 2015/0065840 A1* | 3/2015 | Bailey | A61B 5/296 600/384 |
| 2018/0151835 A1* | 5/2018 | Kim | H01L 51/5253 |
| 2018/0182838 A1* | 6/2018 | Yeo | H01L 27/3279 |
| 2018/0253170 A1* | 9/2018 | Noh | G06F 3/0443 |
| 2020/0094466 A1* | 3/2020 | Vachicouras | B32B 27/281 |
| 2020/0243778 A1* | 7/2020 | Li | H01L 27/3258 |

* cited by examiner

*Primary Examiner* — Hoa C Nguyen
(74) *Attorney, Agent, or Firm* — Westman, Champlin & Koehler, P.A.

(57) ABSTRACT

Embodiments of the present disclosure provide a display substrate, a display device, and a method for manufacturing a display substrate. The display substrate includes: a plurality of bearing parts for supporting display assemblies; and a connecting beam located between two bearing parts and connected to the two bearing parts. The connecting beam includes at least one stretchable portion with a hollow portion provided inside the stretchable portion, so that the stretchable portion is deformable in a first direction and a second direction, and the second direction is perpendicular to the first direction.

14 Claims, 7 Drawing Sheets

DISPLAY SUBSTRATE, DISPLAY DEVICE AND METHOD FOR MANUFACTURING DISPLAY SUBSTRATE

CROSS-REFERENCE TO RELATED APPLICATION

This application claims priority of Chinese Patent Application No. 201911304902.3 filed on Dec. 17, 2019 in China National Intellectual Property Administration, the disclosure of which is incorporated herein by reference in entirety.

TECHNICAL FIELD

Embodiments of the present disclosure relate to the field of intelligent display technology, and in particular, to a display substrate, a display device, and a method for manufacturing a display substrate.

BACKGROUND

With the development of science and technology, bendable flexible display devices have become more and more popular for users. However, when the display device is folded or bent, a substrate often breaks because it cannot provide a sufficient amount of deformation, thereby degrading the display effect.

SUMMARY

According to a first aspect of the present disclosure, there is provided a display substrate, comprising:

a plurality of bearing parts for supporting display assemblies; and a connecting beam located between two bearing parts and connected to the two bearing parts, wherein the connecting beam comprises at least one stretchable portion with a hollow portion provided inside the stretchable portion, so that the stretchable portion is deformable in a first direction and a second direction, and the second direction is perpendicular to the first direction.

According to some embodiments of the present disclosure, the stretchable portion has a substantially parallelogram shape in a cross section parallel to the display substrate.

According to some embodiments of the present disclosure, the stretchable portion has a substantially rhombus shape in the cross section parallel to the display substrate, and two diagonal lines of the rhombus are parallel to the first direction and the second direction, respectively.

According to some embodiments of the present disclosure, the rhombus shape formed by the stretchable portion has a first diagonal line and a second diagonal line, the first diagonal line is parallel to the first direction, and the second diagonal line is parallel to the second direction; the rhombus shape formed by the stretchable portion has a first included angle and a second included angle, and the first included angle is greater than or equal to the second included angle;

the stretchable portion is switchable among a stretched state, a compressed state, and an initial state;

when the stretchable portion is switched from the initial state to the stretched state, the first diagonal line is extended and the second diagonal line is shortened; when the stretchable portion is switched from the initial state to the compressed state, the second diagonal line is extended and the first diagonal line is shortened; when the stretchable portion is in the initial state, the first included angle is greater than or equal to 90 degrees and less than or equal to 150 degrees, and the second included angle is greater than or equal to 30 degrees and less than or equal to 90 degrees.

According to some embodiments of the present disclosure, the stretchable portion has a substantially ellipse shape in a cross section parallel to the display substrate, a major axis of the ellipse shape is parallel to the first direction, and a minor axis of the ellipse shape is parallel to the second direction.

According to some embodiments of the present disclosure, the connecting beam is smoothly transited to the bearing parts.

According to some embodiments of the present disclosure, adjacent wall surfaces of the stretchable portion are smoothly connected.

According to some embodiments of the present disclosure, the display substrate comprises a plurality of the connecting beams, and two adjacent bearing parts are connected by the plurality of the connecting beams.

According to some embodiments of the present disclosure, the connecting beam comprises a plurality of the stretchable portions, and two adjacent stretchable portions are connected to each other.

According to some embodiments of the present disclosure, the plurality of the stretchable portions are distributed in an array, rows of the array are parallel to the first direction, and columns of the array are parallel to the second direction.

According to some embodiments of the present disclosure, the plurality of the stretchable portions comprise a plurality of rows of stretchable portions arranged in the second direction, and adjacent rows of stretchable portions are misaligned.

According to some embodiments of the present disclosure, a ratio of a size of the connecting beam to a size of the bearing parts in the first direction or the second direction is greater than or equal to 1/10 and less than or equal to 1/4.

According to some embodiments of the present disclosure, a width of a wall surface of the stretchable portion is greater than or equal to 5 micrometers and less than or equal to 20 micrometers.

According to some embodiments of the present disclosure, the connecting beam and the bearing parts are formed of polyimide.

According to some embodiments of the present disclosure, a passivation layer and an electrical conductor both extend in the bearing parts and the connecting beam.

According to a second aspect of the present disclosure, there is provided a display device, comprising a display panel and the display substrate according to any one of the above embodiments, wherein the display panel is disposed above the display substrate, and the display panel comprises a plurality of display assemblies disposed above the bearing parts.

According to a third aspect of the present disclosure, there is provided a method for manufacturing the display substrate according to any one of the above embodiments, comprising:

depositing a first base portion on a glass substrate;

depositing a first passivation layer on the first base portion;

depositing an electrical conductor on the first passivation layer;

depositing a second passivation layer on the electrical conductor;

depositing a second base portion, the second base portion covering the second passivation layer, the electrical conductor and the first passivation layer, and the second base portion covering the first base portion; and performing a patterning process to the second base portion and the first base portion, the first base portion, the first passivation layer, the electrical conductor, the second passivation layer and the second base portion forming the connecting beam and the bearing parts.

It should be understood that the above general description and the following detailed description are merely exemplary and explanatory, and they should not limit the present disclosure.

DETAILED DESCRIPTION OF EMBODIMENTS

Figure 1:
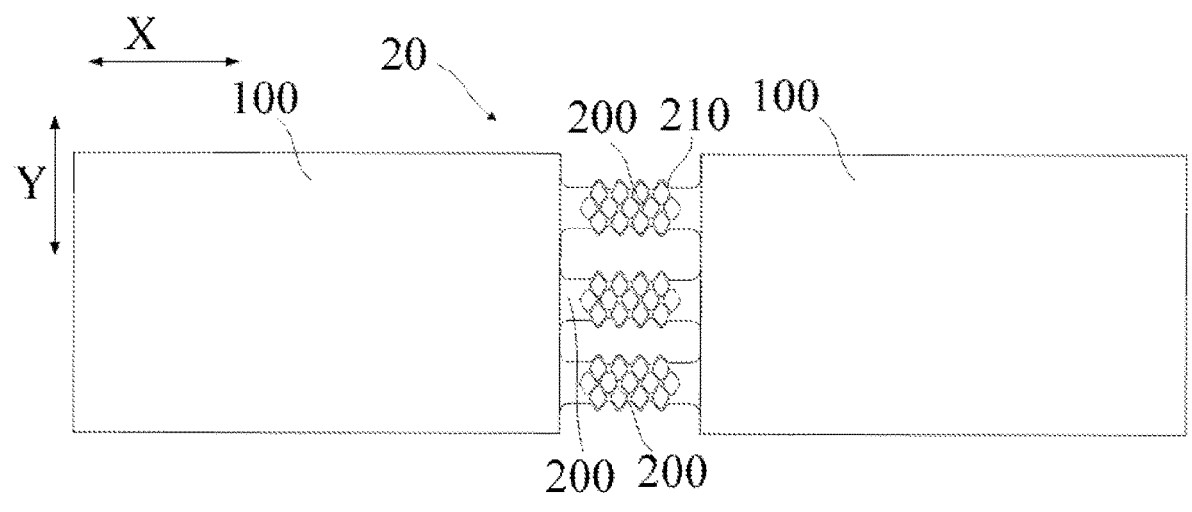
FIG. 1 is a schematic structural view of a substrate according to an embodiment of the present disclosure.

Exemplary embodiments will be described in detail herein, and examples thereof are illustrated in the accompanying drawings. In a case where the following description refers to the accompanying drawings, the same numeral references in different drawings represent the same or similar elements unless otherwise indicated. The examples described in the following exemplary embodiments do not represent all the embodiments of the present disclosure. Rather, they are merely examples of devices and methods in consistent with some aspects of the present disclosure, as detailed in the appended claims.

The terminology used in the present disclosure is only for the purpose of describing particular embodiments but is not intended to limit the present disclosure. As used in the specification and the appended claims of the present disclosure, the singular element with "a", "an", and "the" is intended to comprise a plurality of the elements as well, unless clearly indicated otherwise in the context. It should also be understood that the term "and/or" as used herein is intended to include any one or all possible combinations of one item or more associated, listed items.

It should be understood that the terms "first", "second", and the like used in the specification and the claims of the present disclosure do not indicate any order, quantity, or importance, but are only used to distinguish different components. Similarly, similar words such as "a" or "an" do not indicate a limit on quantity, but rather indicate that there may be at least one element listed. Unless stated otherwise, the terms such as "front", "rear", "lower" and/or "upper" are merely for convenience of explanation, but are not limited to the position or the spatial orientation. The words "comprise", "include" or the like mean that the elements or members listed before "comprise" or "include" encompass the elements or members listed after "comprise" or "include" and their equivalents, but do not exclude other elements or members. The words "connect", "join" or the like are not limited to a physical or mechanical connection, but may include an electrical connection, whether direct or indirect.

In some embodiments of the present disclosure, there are provided a display substrate, a display device, and a method for manufacturing a display substrate, to avoid the break of the substrate during the deformation thereof as for as possible.

The embodiments of the present disclosure will be described in detail below with reference to the drawings. The features of the following embodiments and examples can be combined with each other unless they are in conflict.

Embodiments of the present disclosure relate to a display device, and the display device referred to herein may be a display, a mobile phone, a computer, an electronic watch, an electronic book, or the like.

The display device includes a glass base, a substrate located on the glass base, and a display panel located above the substrate for intelligent display.

As shown in FIG. 1, the substrate 20 serves as a display substrate and includes bearing parts 100 and a connecting beam 200. The number of the bearing parts 100 is multiple, and the bearing parts are intended for supporting display assemblies, and the connecting beam 200 connects two adjacent bearing parts 100, so that the bearing parts 100 and the connecting beam 200 form a whole for supporting the display panel. The display panel includes a plurality of display assemblies that work independently, and the display assemblies emit light independently, thereby achieving intelligent display of the display device. The display assemblies are disposed above the bearing portion 100, and a plurality of display assemblies may be disposed above each bearing portion 100 to increase Pixel Per Inch (PPI) of the display device. In the embodiment of FIG. 1, the bearing part 100 is rectangular, and the connecting beam 200 may be stretched or compressed.

Figure 2:
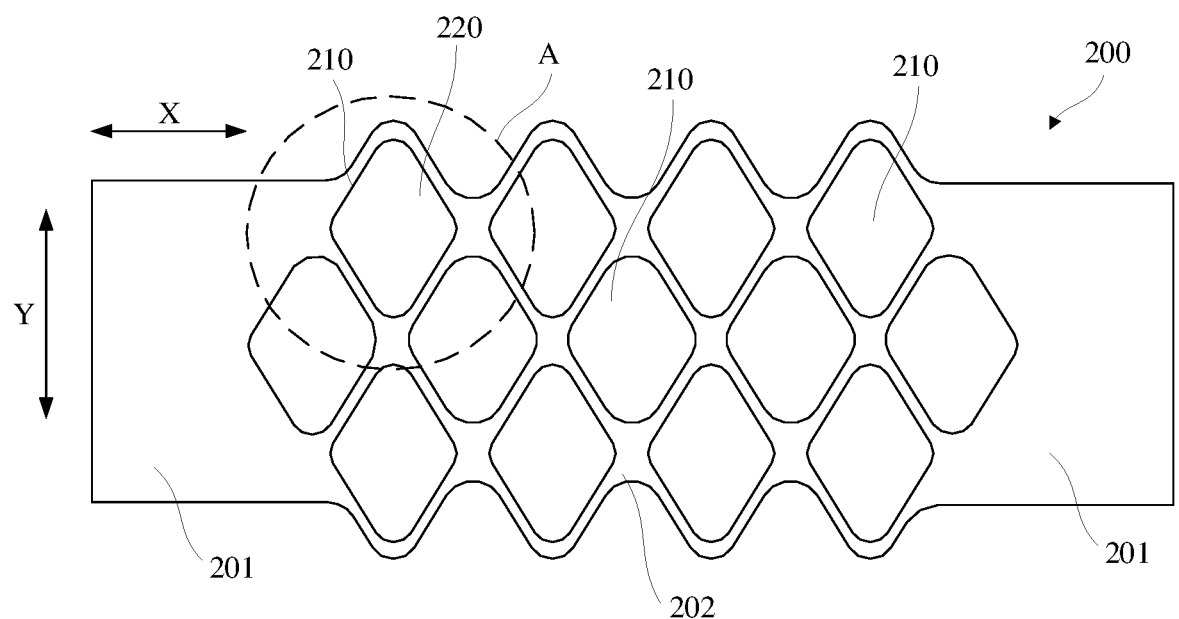
FIG. 2 is a schematic structural view of a connecting beam according to an embodiment of the present disclosure.

As shown in FIG. 2, in a first direction X, the connecting beam 200 includes at least one stretchable portion 210. A hollow receiving space 220, i.e., a hollow portion, is provided inside the stretchable portion 210. The stretchable portion 210 may be deformed in the first direction X and a second direction Y, and the receiving space 220 is used for receiving the deformation of the stretchable portion 210. It should be noted that the second direction Y is perpendicular to the first direction X. Two ends of the connecting beam 200 are respectively connected to two adjacent bearing portions 100 in the first direction X. It should be noted that the first direction X referred to herein is a longitudinal direction of the connecting beam 200.

In the above arrangement, the stretchable portion 210 is deformable in the first direction X and the second direction Y, and the receiving space 220 can receive the deformation of the connecting beam 200 in the first direction X and the second direction Y, that is, the changes in the dimensions of the stretchable portion 210 in the first direction X and the second direction Y may be compensated by changing the shape of the receiving space 220, so that the stretchable portion 210 can deform in shape in various directions and be subject to a certain stress. As a result, the stress at the position where the connecting beam 200 is connected to the bearing part 100 is reduced, and a fracture caused by stress concentration is avoided. When the user needs to bend the display device, the substrate 20 is synchronously bent, thereby the components such as the display assemblies are driven to move, to achieve the bending of the display device. During the bending of the substrate 20, the distance between two adjacent bearing parts 100 needs to be changed, and the size of the connecting beam 200 connecting the bearing parts 100 needs to be changed. In other words, the shape of the stretchable portion 210 in the connecting beam 200 needs to be changed, that is, the dimensions of the stretchable portion 210 in the first direction X and the second direction Y need to be changed. Since the stretchable portion 210 can provide a sufficiently large deformation amount, and the receiving space 220 can receive the deformation amount of the stretchable portion 210, thus adjacent bearing parts 100 may move with respect to each other to a certain extent to achieve flexible deformation of the display device.

Figure 4:
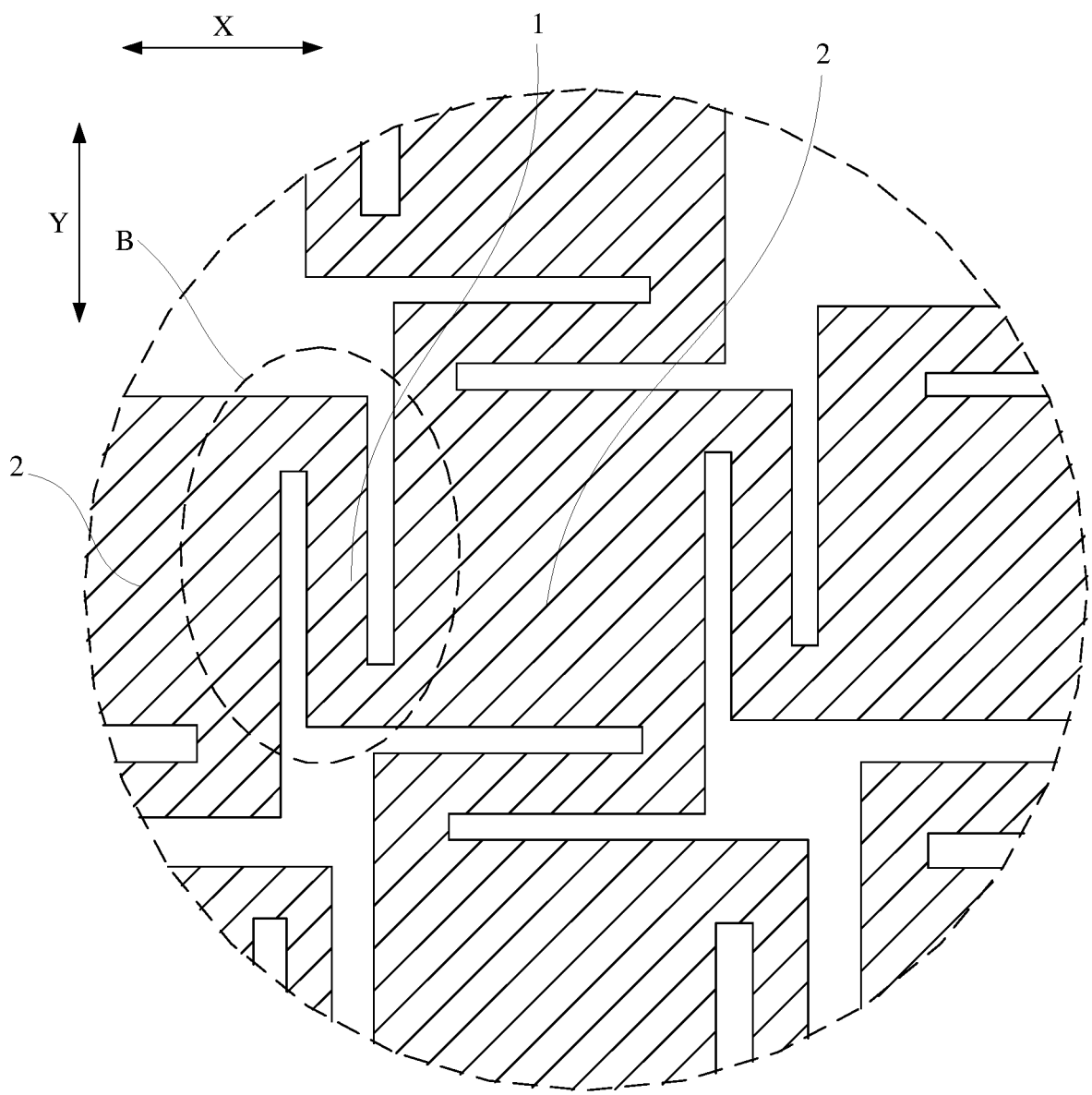
FIG. 4 is a partial schematic structural view of a substrate.
Figure 5:
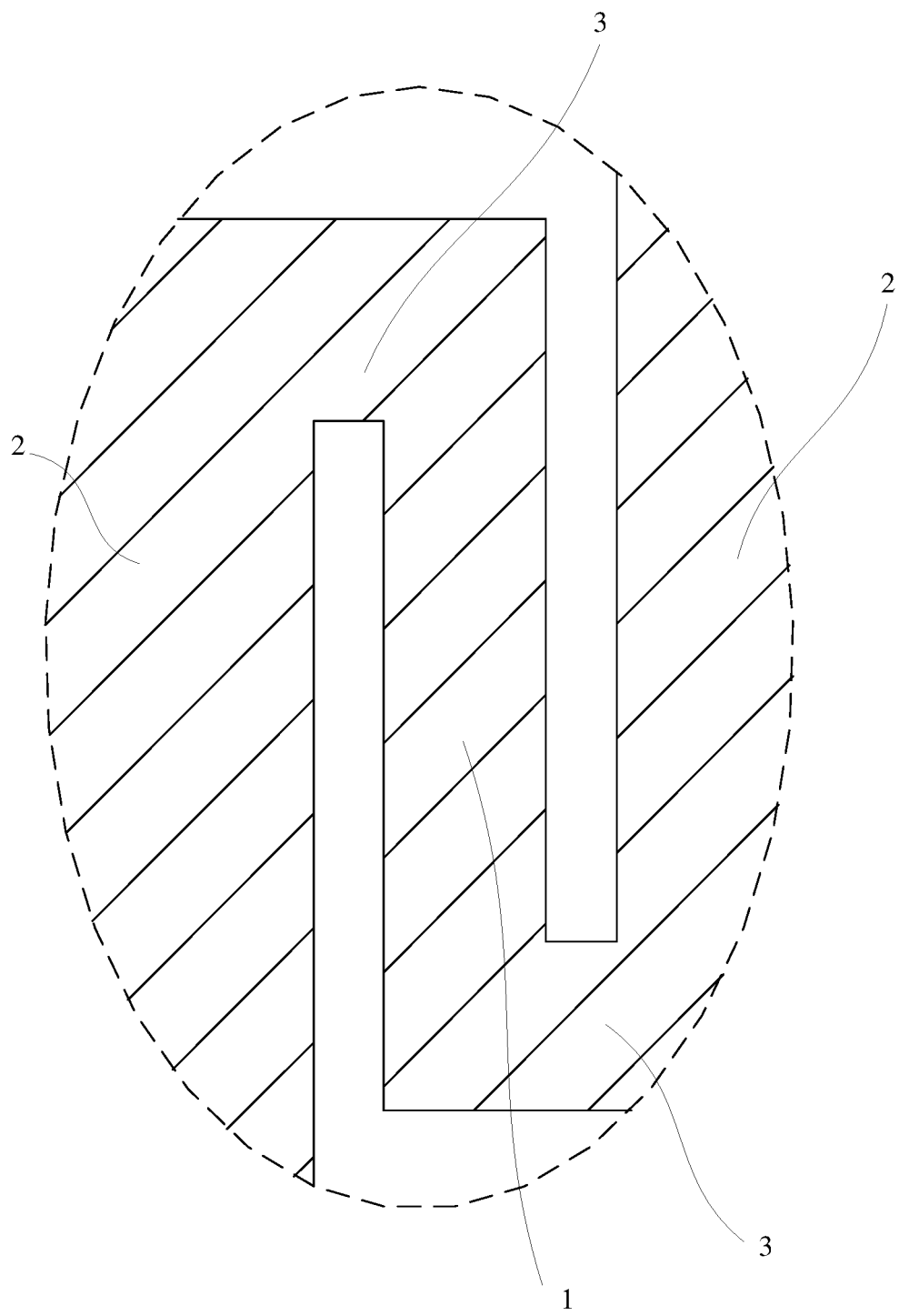
FIG. 5 is an enlarged view of the substrate at a region B in FIG. 4.

In the related art, as shown in FIG. 4 and FIG. 5, connecting parts 1 are generally used to connect adjacent bearing parts 2 in the substrate, and dimensions of projections of the connecting parts in the first direction X and the second direction Y are not zero. When the distance between the adjacent bearing parts 2 changes, it is difficult for the bearing parts 2 to have a large deformation in the second direction Y, and two ends 3 of the bearing part 2 that are fixedly connected to the connecting parts 1 will deform greatly, that is, these locations will be subject to a large amount of stress, thereby causing a break between the connecting part 1 and the bearing part 2.

Figure 3:
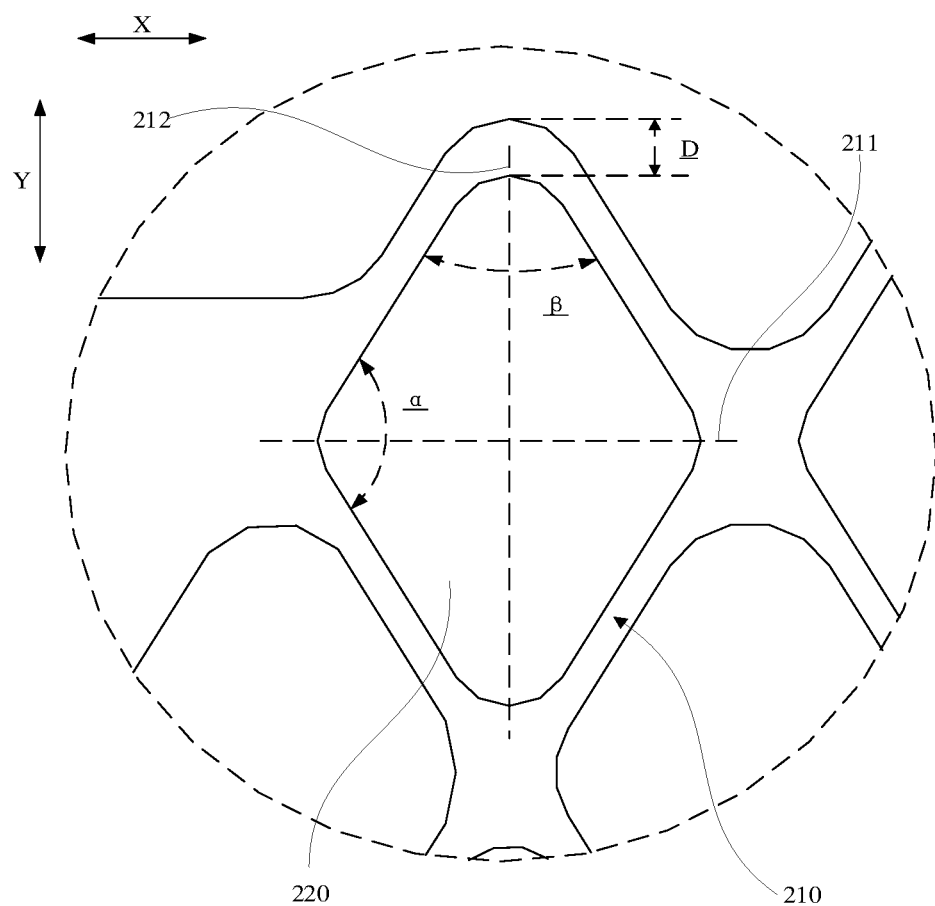
FIG. 3 is an enlarged view of the connecting beam at a region A in FIG. 2.

In the present design, as shown in FIG. 2 and FIG. 3, due to the receiving space 220, the shape of the stretchable portion 210 can be changed greatly, so that the stretchable portion 210 may have a large amount of deformation in both the first direction X and the second direction Y, so as to avoid a large amount of deformation in some local areas, thereby avoiding the break at the position where the connecting beam 200 is connected to the bearing part 100.

In some embodiments, the cross section of the stretchable portion 210 along a horizontal plane is a parallelogram, and one of diagonal lines of the stretching portion 210 is parallel to the first direction X. When the distance between two adjacent bearing parts 100 decreases, the stretchable portion 210 undergoes compression deformation in the first direction X, and thus the size of the stretchable portion 210 in the first direction X decreases while the size of the stretchable portion 210 in the second direction Y increases. Thus, it avoids the connecting beam 200 from being subjected to excessive stress while the connecting beam 200 stably connects two adjacent bearing parts 100. When the distance between two adjacent bearing parts 100 increases, the stretchable portion 210 undergoes stretching deformation in the first direction X, and thus the size of the stretchable portion 210 in the first direction X increases while the size of the stretchable portion 210 in the second direction Y decreases. Thus, it avoids the connecting beam 200 from being subjected to excessive stress while the connecting beam 200 stably connects two adjacent bearing parts 100.

Figure 6:
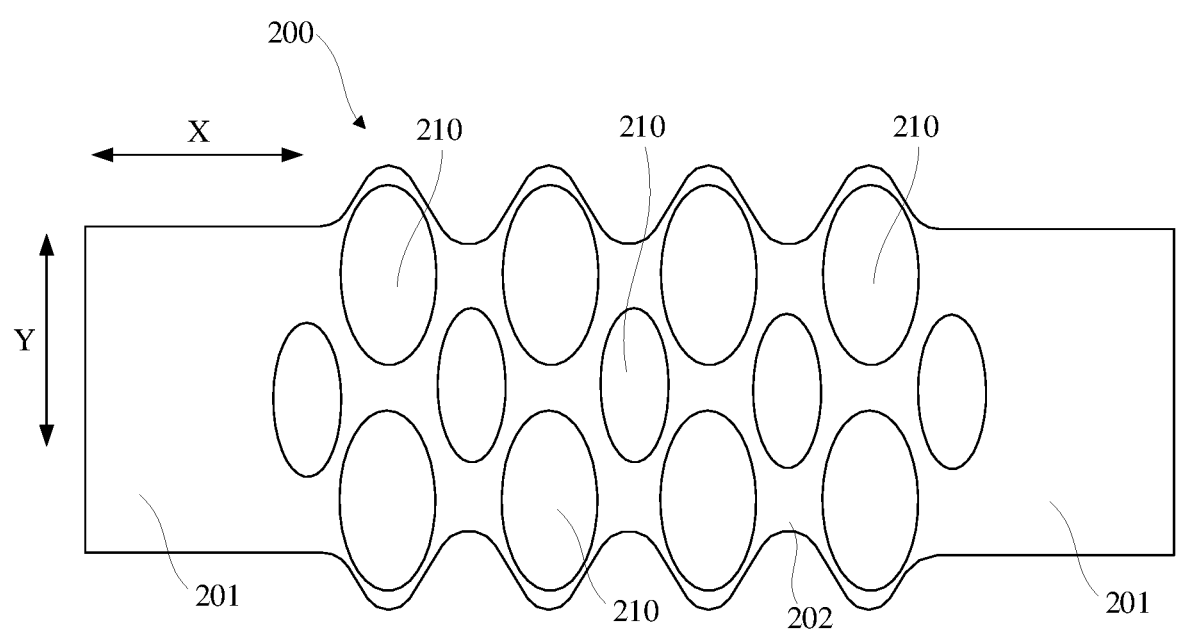
FIG. 6 is a schematic structural view of a connecting beam according to an embodiment of the present disclosure.

Of course, in other embodiments, as shown in FIG. 6, the cross section of the stretchable portion 210 along the horizontal plane may have an ellipse shape. A major axis of the ellipse is parallel to the second direction Y, and a minor axis of the ellipse is parallel to the first direction X. Alternatively, a minor axis of the ellipse is parallel to the second direction Y, and a major axis of the ellipse is parallel to the first direction X. In the above arrangement, the stretchable portion 210 can generate a large amount of deformation in both the first direction X and the second direction Y, thereby avoiding the occurrence of break or the like of the substrate 20 during bending.

Figure 8:
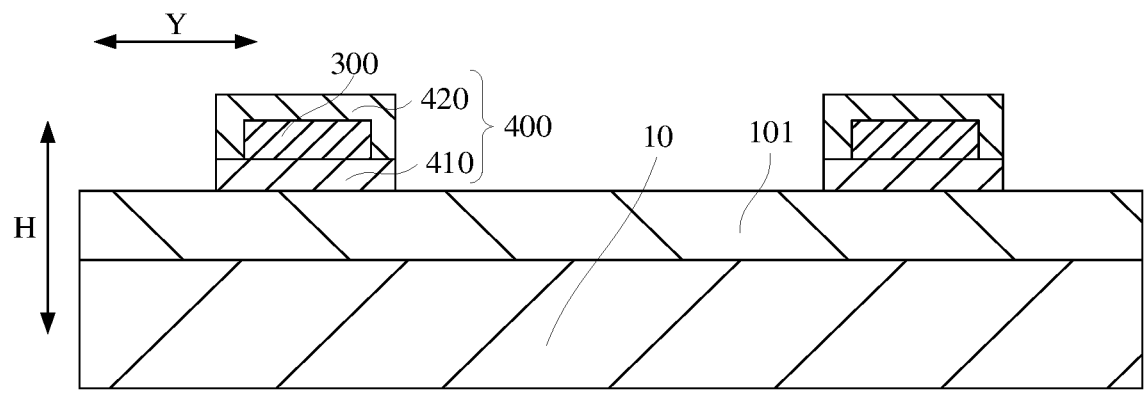
FIG. 8 is a schematic cross-sectional view showing a structure of a display substrate according to an embodiment of the present disclosure.
Figure 9:
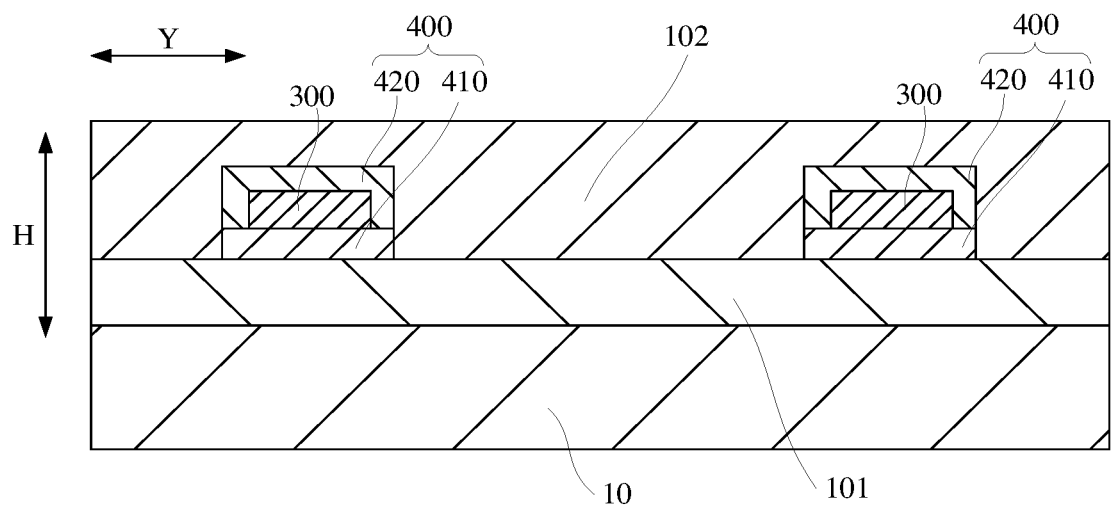
FIG. 9 is a schematic cross-sectional view showing a structure of a display substrate according to an embodiment of the present disclosure.
Figure 10:
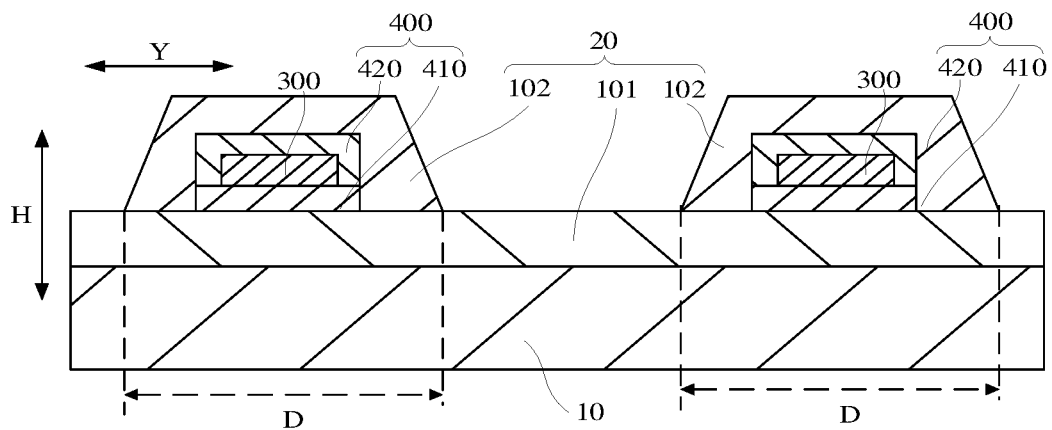
FIG. 10 is a schematic cross-sectional view showing a structure of a display substrate according to an embodiment of the present disclosure.

It should be noted that the first direction X and the second direction Y are both parallel to the horizontal plane, and a height direction H of the substrate 20 is perpendicular to the horizontal plane (referring to FIGS. 8 to 10).

As shown in FIGS. 2 and 3, in this embodiment, the cross section of the stretchable portion 210 along the horizontal plane is of a rhombus shape. Two diagonal lines of the rhombus are parallel to the first direction X and the second direction Y, respectively. With the above arrangement, the different sides of the stretchable portion 210 have the same dimensions, so that a large amount of deformation can be generated in the stretchable portion 210 in the first direction X and the second direction Y, and at the same time, the stability of the rhombic stretchable portion 210 may be ensured when deformed.

The two diagonal lines of the stretchable portion 210 are a first diagonal line 211 and a second diagonal line 212, respectively. The first diagonal line 211 is parallel to the first direction X, and the second diagonal line 212 is parallel to the second direction Y. The stretchable portion 210 includes a first included angle α and a second included angle β. The first included angle α is greater than or equal to the second included angle β. The first included angle α faces the second diagonal line 212 and the second included angle β faces the first diagonal line 211. The stretchable portion 210 may be switched among a stretched state, a compressed state, and an initial state. When the stretching section 210 is switched from the initial state to the stretched state, the first diagonal line 211 is extended, the second diagonal line 212 is shortened, the first included angle α becomes smaller, and the second included angle β becomes larger. When the stretchable portion 210 is switched from the initial state to the compressed state, the second diagonal line 212 is extended, the first diagonal line 211 is shortened, the first included angle α becomes larger, and the second included angle β becomes smaller. When the stretchable portion 210 is in the initial state, the first included angle α is greater than or equal to 90 degrees and less than or equal to 150 degrees, and the second included angle β is greater than or equal to 30 degrees and less than or equal to 90 degrees. Through a large number of experiments, it can be known that when the values of the first included angle α and the second included angle β are in the above range, the amounts of deformation generated at the respective positions of the stretchable portion 210 are relatively uniform, so that the stresses at the respective positions of the stretchable portion 210 are roughly same, avoiding the problem of stress concentration due to excessive local deformation of the stretchable portion 210 and poor stability of the stretchable portion 210.

In this embodiment, when the stretchable portion 210 is in the initial state, the first included angle is 120 degrees, and the second included angle is 60 degrees. It can be known from experiments that when the stretching effect of the substrate 20 in the first direction X is 2%-6%, the received stresses and the generated strains at the respective positions of the stretchable portion 210 increase uniformly, and the received stresses and the generated strains at the respective positions are relatively uniform, thereby avoiding the breakage of the stretchable portion 210 due to local stress concentration during stretching, and ensuring better stretchability and higher reliability of the substrate 20 and the display device.

It should be noted that the stretching effect referred to herein is a ratio of a deformation amount of the substrate 20 in the first direction X when stretched to the size of the substrate 20 in the initial state.

According to some embodiments of the present disclosure, the connecting beam 200 is smoothly transited to the bearing part 100, that is, the connection between the connecting beam 200 and the bearing part 100 is of an arc shape. Through the above arrangement, the variation of the stress concentration can be transmitted to the stretchable portion 210 of the connecting beam 200, thereby avoiding the breakage at the position where the connecting beam 200 is connected to the bearing part 100, due to stress concentration.

According to some embodiments of the present disclosure, as shown in FIG. 1, adjacent wall surfaces of the stretchable portion 210 are smoothly connected to each other. Through the above arrangement, the problem of stress concentration in the stretchable portion 210 can also be avoided, and the stresses at the respective positions in the stretchable portion 210 can be relatively balanced, and better stretchability and higher reliability of the substrate 20 and the display device can be ensured.

According to some embodiments of the present disclosure, there are a plurality of the connecting beams 200, and two adjacent bearing parts 100 are connected by the plurality of connecting beams 200. In this embodiment, the number of the connecting beams 200 connecting two adjacent bearing parts 100 is three. Of course, in other embodiments, the number of the connecting beams 200 connecting two adjacent bearing parts 100 may be two, four or more. Through the above arrangement, it is possible to ensure that the substrate 20 has better stretchability and higher reliability.

According to some embodiments of the present disclosure, as shown in FIG. 2, the connecting beam 200 includes a plurality of stretchable portions 210 in both the first direction X and the second direction Y. The connecting beam 200 includes connecting regions 201 and a stretchable region 202. The connecting regions 201 are used to connect the bearing part 100, and the stretchable portions 210 are provided in the stretchable region 202. In the second direction Y, the plurality of stretchable portions 210 are misaligned. In the above arrangement, in the first direction X, the stretchable portions 210 are provided at the respective positions of the connecting beam 200, so that there are uniform deformations at the respective positions of the stretchable region 202 of the connecting beam 200, and the amounts of deformation at the respective positions of the stretchable region 202 are more uniform.

In the above embodiment, as shown in FIG. 1, a ratio of a size of the connecting beam 200 to a size of the bearing part 100 in the first direction X is greater than or equal to 1/10 and less than or equal to 1/4. Since the bearing part 100 in the substrate 20 cannot be stretched or bent, the deformation of the substrate 20 is generated only by the connecting beam 200. Therefore, ensuring the ratio of the size of the connecting beam 200 to the size of the bearing part 100 can ensure that the substrate 20 and the display device can be bent or deformed in a relatively large range. Since the display assemblies are disposed above the bearing portion 100, ensuring the size ratio of the bearing part 100 can ensure the pixel per inch (PPI) of the display device. It can be seen from experiments that when the ratio of the size of the connecting beam 200 to the size of the bearing part 100 is within the above range, it is possible to ensure that the substrate 20 can be sufficiently bent or deformed while ensuring that the display device has a pixel per inch (PPI), so as to improve the user experience.

According to some embodiments of the present disclosure, as shown in FIGS. 3 and 10, the width D of the stretchable portion 210 is greater than or equal to 5 μm, and less than or equal to 20 μm. In this embodiment, the width D of the stretchable portion 210 is 10 μm, and a ratio of a thickness of the stretchable portion 210 to the width D of the stretchable portion 210 is 2. Through the above arrangement, while ensuring the strength of the stretchable portion 210, it is avoided that the stretchable portion 210 cannot be recognized by the naked eyes of the user, thereby improving the user experience.

As shown in FIG. 10, the substrate 20 further includes an electrical conductor 300 and a passivation layer 400. The electrical conductor 300 extends inside the bearing part 100 and the connecting beam 200 to realize electrical connection of components in the display device. The material of the electrical conductor 300 may be a metal material having electrically conductive properties such as copper. The passivation layer 400 covers the electrical conductor 300 to isolate the electrical conductor 300 from external impurities (for example, water or oxygen), and meanwhile, to prevent damage to the electrical conductor 300 caused by subsequent manufacturing processes. Both the passivation layer 400 and the electrical conductor 300 extend inside the bearing part 100 and the connecting beam 200. The material of the passivation layer 400 may be silicon oxide. The material of the bearing part 100 and the connecting beam 200 may be polyimide (PI), which has the characteristics of such as high temperature resistance and high insulation.

Figure 7:
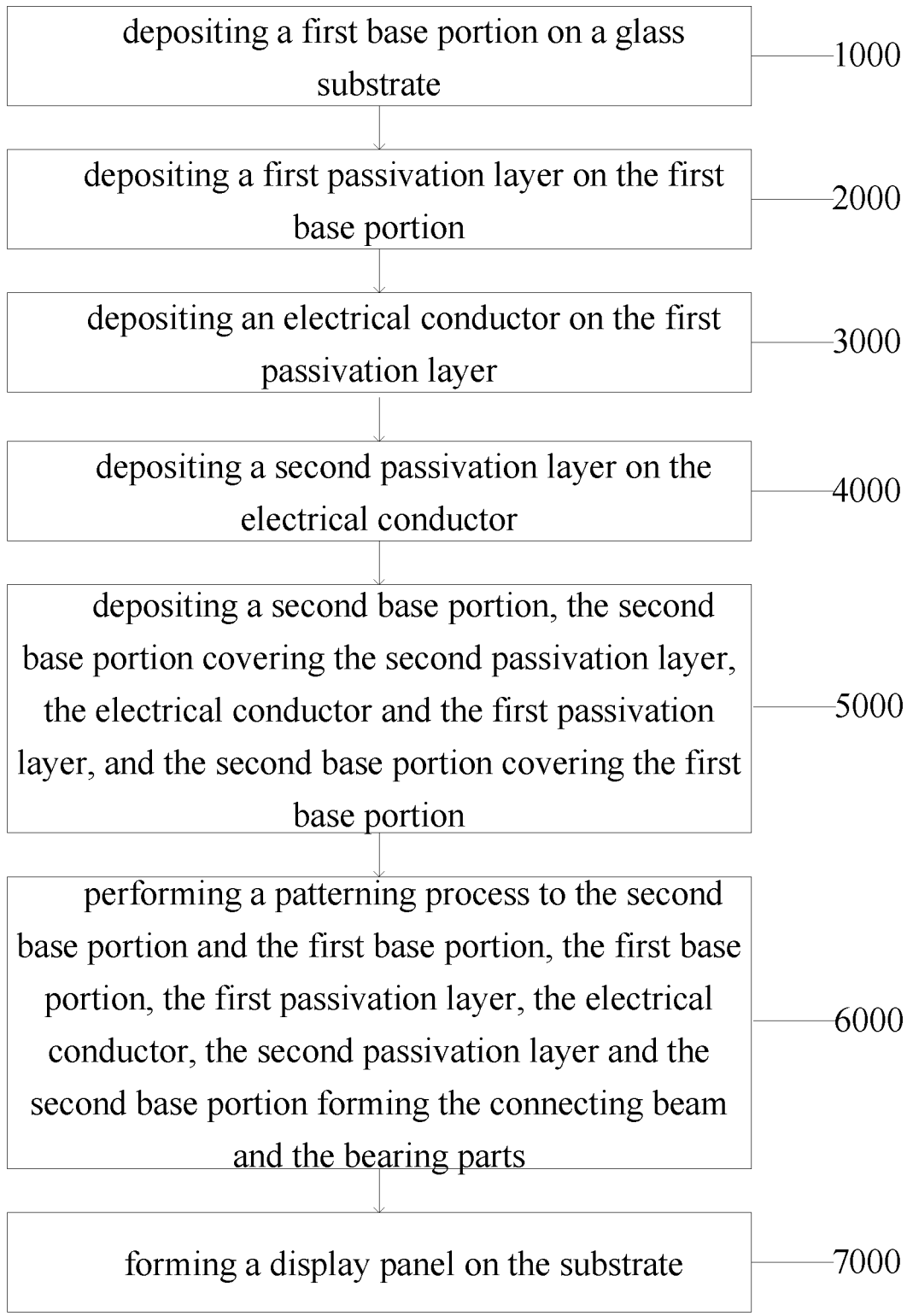
FIG. 7 is a simplified flowchart of a method for manufacturing a display substrate according to an embodiment of the present disclosure.

As shown in FIG. 7, in an embodiment of the present disclosure, there is provided a method for manufacturing a display device, the method including:

Step 1000: depositing a first base portion 101 on a glass substrate 10.

Step 2000: depositing a first passivation layer 410 on the first base portion 101.

Step 3000: depositing an electrical conductor 300 on the first passivation layer 410.

Step 4000: depositing a second passivation layer 420 on the electrical conductor 300. At this time, as shown in FIG. 8, the second passivation layer 420 and the first passivation layer 410 wrap the electrical conductor 300 to protect the electrical conductor 300.

Step 5000: depositing a second base portion 102, the second base portion 102 covering the second passivation layer 420, the electrical conductor 300 and the first passivation layer 410, and the second base portion 102 covering the first base portion 101. At this time, as shown in FIG. 9, the second base portion 102 covers the passivation layer 400 and the first base portion 101, thereby realizing that the first base portion 101 and the second base portion 102 wrap the passivation layer 400 and the electrical conductor 300.

Step 6000: performing a patterning process to the second base portion 102 and the first base portion 101, the first base portion 101, the first passivation layer 410, the electrical conductor 300, the second passivation layer 420, and the second base portion 102 forming the connecting beam 200 and bearing part 100.

Through the above arrangement, as shown in FIG. 10, the first passivation layer 410 and the second passivation layer 420 after the patterning process still cover the electrical conductor 300 and serve as the passivation layer 400. The first base portion 101 and the second base portion 102 are bonded together to serve as the bearing part 100 and the connecting beam 200. The material of the first base portion 101 and the second base portion 102 is polyimide (PI). The first base portion 101 and the second base portion 102 wrap the passivation layer 400 and the electrical conductor 300 and serve as the substrate 20 of the display device.

Step 7000: forming a display panel on the substrate 20, to form a display device for intelligent display.

The technical solutions provided by the embodiments of the present disclosure have the following beneficial effects:

The stretchable portion can be deformed in the first direction and the second direction, the receiving space can receive the deformation amount of the connecting beam, that is, the changes in the dimensions of the stretchable portion in the first direction and the second direction may be compensated by changing the shape of the receiving space, the stresses at the respective positions of the stretchable portion, especially the positions where the connecting beam is connected to the bearing part can be reduced, to avoid the fracture caused by stress concentration. In the process of bending the substrate, the stretchable portion can provide a sufficiently large deformation amount, and the receiving space can receive the deformation amount of the stretchable portion, thus a certain amount of relative movement can occur between adjacent bearing parts, so as to achieve flexible deformation of the display device.

The above description only refers to the exemplified embodiments of the present disclosure, but does not limit the present disclosure in any form. Although the present disclosure has been disclosed as above with the exemplified embodiments, it is not intended to limit the present disclosure. Some changes or modifications may be made by those skilled in the art based on the above contents in the present disclosure, without departing from the scope of the present disclosure, and such changes or modifications may be deemed as equivalent embodiments of the present disclosure. Any simple changes, equivalent variations, and modifications to the above embodiments that are made based on the technical essence of the present disclosure but does not depart from the technical solutions of the present disclosure still fall within the scope of the present disclosure.

What is claimed is:

1. A display substrate, comprising:
   a plurality of bearing parts for supporting display assemblies; and
   a connecting beam located between two bearing parts and connected to the two bearing parts,
   wherein the connecting beam comprises at least one stretchable portion with a hollow portion provided inside the stretchable portion, so that the stretchable portion is deformable in a first direction and a second direction, and the second direction is perpendicular to the first direction;
   wherein the stretchable portion has a substantially rhombus shape in the cross section parallel to the display substrate, and two diagonal lines of the rhombus are parallel to the first direction and the second direction, respectively; and
   wherein the rhombus shape formed by the stretchable portion has a first diagonal line and a second diagonal line, the first diagonal line is parallel to the first direction, and the second diagonal line is parallel to the second direction; the rhombus shape formed by the stretchable portion has a first included angle and a second included angle, and the first included angle is greater than or equal to the second included angle;
   the stretchable portion is switchable among a stretched state, a compressed state, and an initial state;
   when the stretchable portion is switched from the initial state to the stretched state, the first diagonal line is extended and the second diagonal line is shortened; when the stretchable portion is switched from the initial state to the compressed state, the second diagonal line is extended and the first diagonal line is shortened; when the stretchable portion is in the initial state, the first included angle is greater than or equal to 90 degrees and less than or equal to 150 degrees, and the second included angle is greater than or equal to 30 degrees and less than or equal to 90 degrees.

2. The display substrate according to claim 1, wherein the stretchable portion has a substantially ellipse shape in a cross section parallel to the display substrate, a major axis of the ellipse shape is parallel to the first direction, and a minor axis of the ellipse shape is parallel to the second direction.

3. The display substrate according to claim 1, wherein the connecting beam is smoothly transited to the bearing parts.

4. The display substrate according to claim 1, wherein adjacent wall surfaces of the stretchable portion are smoothly connected.

5. The display substrate according to claim 1, wherein the display substrate comprises a plurality of the connecting beams, and two adjacent bearing parts are connected by the plurality of the connecting beams.

6. The display substrate according to claim 1, wherein the connecting beam comprises a plurality of the stretchable portions, and two adjacent stretchable portions are connected to each other.

7. The display substrate according to claim 6, wherein the plurality of the stretchable portions are distributed in an array, rows of the array are parallel to the first direction, and columns of the array are parallel to the second direction.

8. The display substrate according to claim 6, wherein the plurality of the stretchable portions comprise a plurality of rows of stretchable portions arranged in the second direction, and adjacent rows of stretchable portions are misaligned.

9. The display substrate according to claim 1, wherein a ratio of a size of the connecting beam to a size of the bearing parts in the first direction or the second direction is greater than or equal to 1/10 and less than or equal to 1/4.

10. The display substrate according to claim 1, wherein a width of a wall surface of the stretchable portion is greater than or equal to 5 micrometers and less than or equal to 20 micrometers.

11. The display substrate according to claim 1, wherein the connecting beam and the bearing parts are formed of polyimide.

12. The display substrate according to claim 1, wherein a passivation layer and an electrical conductor both extend in the bearing parts and the connecting beam.

13. A display device, comprising a display panel and the display substrate according to claim 1, wherein the display panel is disposed above the display substrate, and the display panel comprises a plurality of display assemblies disposed above the bearing parts.

14. A method for manufacturing the display substrate according to claim 1, comprising:
   depositing a first base portion on a glass substrate;
   depositing a first passivation layer on the first base portion;
   depositing an electrical conductor on the first passivation layer;
   depositing a second passivation layer on the electrical conductor;

depositing a second base portion, the second base portion covering the second passivation layer, the electrical conductor and the first passivation layer, and the second base portion covering the first base portion; and performing a patterning process to the second base portion and the first base portion, the first base portion, the first passivation layer, the electrical conductor, the second passivation layer and the second base portion forming the connecting beam and the bearing parts.

\* \* \* \* \*